(12) United States Patent
Shapiro et al.

(10) Patent No.: US 11,569,812 B2
(45) Date of Patent: Jan. 31, 2023

(54) RF SWITCH STACK WITH CHARGE CONTROL ELEMENTS

(71) Applicant: pSemi Corporation, San Diego, CA (US)

(72) Inventors: Eric S. Shapiro, San Diego, CA (US); Simon Edward Willard, Irvine, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 16/902,032

(22) Filed: Jun. 15, 2020

(65) Prior Publication Data

US 2021/0391858 A1  Dec. 16, 2021

(51) Int. Cl.
  *H03K 17/687* (2006.01)
  *H03K 17/693* (2006.01)
(52) U.S. Cl.
  CPC ....... *H03K 17/687* (2013.01); *H03K 17/6871* (2013.01); *H03K 17/693* (2013.01)
(58) Field of Classification Search
  CPC ......... H03K 17/687; H03K 2217/0018; H03K 2217/0054
  See application file for complete search history.

(56) References Cited

U.S. PATENT DOCUMENTS

| | | | |
|---|---|---|---|
| 10,044,349 B2 * | 8/2018 | Scott | H03K 17/161 |
| 10,236,872 B1 * | 3/2019 | Willard | H01L 25/0657 |
| 10,680,599 B1 | 6/2020 | Syroiezhin et al. | |
| 10,715,133 B1 | 7/2020 | Scott et al. | |
| 2008/0129642 A1 | 6/2008 | Ahn et al. | |
| 2011/0260774 A1 | 10/2011 | Granger-Jones et al. | |
| 2014/0118053 A1 | 5/2014 | Matsuno | |
| 2015/0171860 A1 | 6/2015 | Blin | |

(Continued)

FOREIGN PATENT DOCUMENTS

| | | |
|---|---|---|
| CN | 114629479 A | 6/2022 |
| JP | 2010010728 A | 1/2010 |

(Continued)

OTHER PUBLICATIONS

Restriction Requirement for U.S. Appl. No. 17/119,840, filed Dec. 11, 2020 on behalf of Psemi Corporation dated May 17, 2021 6 pages.

(Continued)

*Primary Examiner* — Ryan Johnson
*Assistant Examiner* — Colleen J O Toole
(74) *Attorney, Agent, or Firm* — Steinfl + Bruno LLP

(57) ABSTRACT

Methods and devices to address the undesired DC voltage distribution across switch stacks in OFF state are disclosed. The disclosed devices include charge control elements that sample the RF signal to generate superimposed voltages at specific points of the switch stack biasing circuit. The provided voltages help reducing the drooping voltages on drain/source/body terminals of the transistors within the stack by supplying the current drawn by drain/source terminals of the stacked transistors and/or by sinking the body leakage current exiting the body terminals of such transistors. Methods and techniques teaching how to provide proper tapping points in the biasing circuit to sample the RF signal are also disclosed.

35 Claims, 14 Drawing Sheets

(56) References Cited

U.S. PATENT DOCUMENTS

| | | | |
|---|---|---|---|
| 2015/0341026 A1* | 11/2015 | de Jongh | H04B 1/40 327/382 |
| 2016/0085256 A1 | 3/2016 | Cam | |
| 2019/0245533 A1 | 8/2019 | Schleicher et al. | |
| 2019/0305768 A1 | 10/2019 | Willard et al. | |
| 2019/0305769 A1 | 10/2019 | Willard | |
| 2020/0119731 A1 | 4/2020 | Teggatz et al. | |
| 2020/0382114 A1 | 12/2020 | Scott et al. | |
| 2022/0038092 A1 | 2/2022 | Genc | |
| 2022/0038097 A1 | 2/2022 | Genc et al. | |
| 2022/0038099 A1 | 2/2022 | Genc | |
| 2022/0190826 A1 | 6/2022 | Willard | |

FOREIGN PATENT DOCUMENTS

| | | |
|---|---|---|
| KR | 100916472 B1 | 9/2009 |
| KR | 102034620 B1 | 11/2019 |
| WO | 2022/035603 A1 | 2/2022 |
| WO | 2022/125274 A1 | 6/2022 |

OTHER PUBLICATIONS

Non-Final Office Action for U.S. Appl. No. 16/945,283, filed Jul. 31, 2020 on behalf of Psemi Corporation dated Mar. 2, 2021 24 pages.

International Search Report and Written Opinion for PCT/US2021/037479 filed on Jun. 15, 2021 on behalf of pSemi Corporation, dated Oct. 7, 2021. 8 pages.

Ex Parte Quayle for U.S. Appl. No. 17/119,840, filed Dec. 11, 2020, on behalf of Psemi Corporation. Mail Date: Aug. 13, 2021. 8 pages.

Final Office Action for U.S. Appl. No. 16/945,283, filed Jul. 31, 2020, on behalf of Psemi Corporation, dated Dec. 3, 2021. 31 Pages.

Notice of Allowance for U.S. Appl. No. 17/119,840, filed Dec. 11, 2020, on behalf of Psemi Corporation, dated Oct. 22, 2021. 5 Pages.

Corrected Notice of Allowability for U.S. Appl. No. 16/945,283, filed Jul. 31, 2020 on behalf of Psemi Corporation dated Jul. 25, 2022. 4 pages.

International Search Report and Written Opinion for International Application No. PCT/US2021/059387 filed on Nov. 15, 2021 on behalf of Psemi Corporation dated Mar. 8, 2022. 9 pages.

International Search Report and Written Opinion for International PCT Application No. PCT/US2021/043544 filed on Jul. 28, 2021 on behalf of pSemi Corporation, dated Feb. 8, 2022. 12 Pages.

International Search Report and Written Opinion for International PCT Application No. PCT/US2021/043544 filed on Jul. 28, 2021 on behalf of pSemi Corporation, dated Jan. 21, 2022. 10 Pages.

Non-Final Office Action for U.S. Appl. No. 17/119,840, filed Dec. 11, 2020 on behalf of Psemi Corporation dated Apr. 18, 2022. 10 pages.

Non-Final Office Action for U.S. Appl. No. 17/386,374, filed Jul. 27, 2021 on behalf of Psemi Corporation dated Jul. 15, 2022. 29 pages.

Non-Final Office Action issued for U.S. Appl. No. 17/386,409, filed Jul. 27, 2021, on behalf of pSemi Corporation, dated Jul. 13, 2022. 28 Pages.

Notice of Allowance for U.S. Appl. No. 16/945,283, filed Jul. 31, 2020 on behalf of Psemi Corporation dated May 10, 2022. 12 pages.

Notice of Allowance for U.S. Appl. No. 17/119,840, filed Dec. 11, 2020, on behalf of Psemi Corporation, dated Jan. 19, 2022. 6 Pages.

Notification of Passing Preliminary Examination issued for Chinese Application No. CN 202111500870.1 filed on Dec. 9, 2021 on behalf of Psemi Corporation, dated Jan. 29, 2022. 2 Pages. CN original + English Translation.

* cited by examiner

RF SWITCH STACK WITH CHARGE CONTROL ELEMENTS

CROSS-REFERENCE TO RELATED APPLICATIONS

The present application may be related to U.S. Pat. No. 10,236,872 B1, filed Mar. 28, 2018, issued on Mar. 19, 2019, and entitled "AC Coupling Modules For Bias Ladders", incorporated herein by reference in its entirety.

BACKGROUND

(1) Technical Field

The present disclosure is related to Radio Frequency (RF) switch stacks, and more particularly to methods and apparatus for designing RF switch stacks including charge control elements.

(2) Background

When designing communication systems, RF switches are generally implemented in stacked configuration due to the large RF power handling requirement of such switch stacks. FIG. 1A shows a prior art field effect transistor (FET) switch stack (100) including a series arrangement of transistors (T1, ..., T4). As may be the case, the FET switch stack (100) is biased using a gate resistive ladder including gate resistors ($R_{G1}, \ldots, R_{G4}$), a body resistive ladder including body resistors ($R_{B1}, R_{B4}$), and a drain-source resistive ladder including drain-source resistors ($R_{DS1}, R_{DS4}$).

In typical operative conditions, and when the transistors are in the ON state, the gate of each transistor may be biased at a positive voltage (e.g. +3V) larger than the threshold voltage of the corresponding transistor, and the drain/source/body of the same transistor may be biased at 0V. When the FET switch stack is in the OFF state, the drain/source of each transistor may be biased at 0V and the gate and body of each transistor may be biased at a negative voltage (e.g. -3V). As shown in FIG. 1A, the top end of the drain-source resistive ladder is connected to the antenna or other RF port(RF path), which is essentially a direct current (DC) ground, and the bottom end of the same ladder is connected to ground in both the ON and OFF states. As such, and in an ideal/desired situation, when the FET switch stack is in the OFF state, the drain-source ladder would not draw any current, or a negligible current, meaning that the drain of each of the transistors (T1, ..., T4) would experience the same DC voltage of approximately 0V.

When a large RF voltage is applied to the antenna, the FET switch stack (100), the drain-source resistive ladder, the gate resistive ladder and the body resistive ladder are all designed to distribute the RF voltage evenly among the FET switch stack (100). The RF signal, having no DC component, does not directly change the DC voltage at any point in the stack. However, during operation, there may be some currents generated within the transistors due to the RF signal applied, which may alter the DC voltage distribution. The RF signal at each point is superimposed on the existing DC voltage. When the FET switch stack (100) is in the "OFF" or non-conducting state, the FET switch stack (100) is designed to conduct no real component of current, which is current in phase with the RF voltage applied. The transistor stack appears as a purely capacitive impedance due to the series gate-drain capacitor Cgd, gate-source capacitor Cgs, plus an additional inherent capacitance between drain and source of each of the transistors (T1, ..., T4). In the OFF state, the transistors will pass no real current with RF voltage applied across drain to source of the transistor as long as the magnitude of the RF voltage is below a critical value (Vpeak). If the RF voltage exceeds such value, the transistor will fail or "break down" and start conducting real current. The value of Vpeak for each transistor is a function of the relative DC voltages between the drain/source DC voltage and the gate DC voltage. The more negative the gate voltage relative to the drain/source voltage, the higher the value of Vpeak. The body DC voltage can also have an impact if it is beyond a certain range, although such impact is generally lower.

Since the maximum voltage each transistor (T1, ..., T4) in the stack can "block" before breaking down is dependent on the amount of negative DC voltage differential between the gate and drain/source terminals, it may be desirable to make the gate terminal appear more negative relative to the drain/source voltage to increase this blocking voltage. This can be accomplished by making the drain/source terminals more positive and/or making the gate nets more negative.

There may be cases in implementations of switch stacks where it is difficult, inconvenient or impossible to apply the desired DC voltages to every transistor in the stack. One example is if it is too costly to include circuitry that can bias the gate terminals negative relative to the drain/source terminals. Another example would be if it is advantageous to have different DC voltage levels for different transistors in the stack because some transistors may need to block more voltage than others. A third example would be if there are undesirable DC currents being generated within the stack that disturbs the externally applied voltage in a uniform or non-uniform manner. Using the example of leakage current in transistor stacks, the above-mentioned points are further clarified.

In practical conditions, more in particular in stacked switches experiencing large RF swings during the OFF state, each transistor within the stack will generate an undesired leakage current that flows from the drain/source to the body of the transistor. Such generated current is referred to as "Ibody" throughout this document. With reference to FIG. 1A, arrows ($i_{b1}, \ldots, i_{b4}$) indicate the body currents, each flowing from the body of the corresponding transistor down through the body resistive ladder and sinking into the power supply ($V_B$). Moreover, and as indicated by arrows ($i_{d1}, \ldots, i_{d4}$), current will flow from the antenna (DC ground) and ground through the drain-source resistive ladder and to the drain-sources of the transistors within the stack. It is pointed out that as the drain-source resistive ladder is connected at both ends to ground, the current flowing in such ladder may follow different directions, downward or upward as indicated by the arrows ($i_{d1}, \ldots, i_{d4}$), and depending on the location of the current within the drain-source resistive ladder. To further clarify the flow of the leakage current, reference is made to FIG. 1A' wherein the leakage current flowing from the drain and source terminals to the body terminal of a transistor is shown.

As a result of what has been described above, the flow of the unwanted leakage current, Ibody, throughout the switch stack modifies the DC voltage distribution across such switch stack. In other words, various switch stack nodes will experience undesired DC bias voltages different from what the biasing circuit would have provided to such nodes in the absence of such leakage current. Throughout the disclosure, the undesired effect of the body leakage current on the DC bias voltage distribution throughout the stack is referred to as the "de-biasing" effect.

With further reference to FIG. 1A, the leakage current flowing from the body to the power supply ($V_B$) will result in voltage drops across the resistors of the body resistive ladder, and as a result, the body of each of the transistors will experience a less negative voltage compared to the ideal/desired case with no leakage current. With the gate and the body resistive ladders being separated, gate voltages will also not be impacted by the leakage current circulation across the FET switch stack. On the other hand, the flow of the leakage current from DC grounds to drain/sources of the transistors generates voltage drops across the resistors of the drain-source resistive ladder and as a result, the drain/source of the transistors will experience more negative voltages compared to the ideal/desired case of 0V DC. With the gate voltage remaining the same, this means that the gate-source voltages will be less negative compared to the ideal/desired scenario, resulting a degradation of power handling of the transistors. In what follows, this point will be further clarified using a numerical example.

FIGS. 1B-1C each show the FET switch stack (100) of FIG. 1A wherein, in the OFF state, the gate and the body resistive ladders are both biased, for example, with a negative DC voltage of –3V and the drain-source resistive ladder is connected to DC ground through the ports.

FIG. 1B represents the ideal/desired situation where it is assumed there is no body leakage current. As can be seen in FIG. 1B, the drains of all the transistors are all biased at 0V, the gates and the bodies are all at –3V and there is practically no DC current flowing through the resistive ladders. This is the ideal/desired scenario.

Ibody exists because of the peak difference in potential between drain to gate. Carriers are generated from the peak voltage. Holes exit through the body, electrons exit through the drain/source. Although generation is pulsed, it is filtered by the resistances and capacitances on the way out. On the other hand, FIG. 1C shows how the DC voltage distribution across the stack is changed resulting in the flow of the leakage current within the switch stack. For example, the drains of the transistors (T1, . . . , T4) are now experiencing DC voltages of (–0.2V, –0.4V, –0.2V, 0V) respectively, instead of all sitting at the desired DC voltage of 0V as indicated in FIG. 1B. As further shown in FIG. 1C, the middle transistors experience the most change in drain voltage due to the flow of Ibody from top and bottom of the drain-source ladder towards the center of the ladder.

Continuing with the same example, and as for the body voltages, the bodies of the transistors (T1, . . . , T4) may experience voltages of (–2.6V, –2.2V, –1.9V, –1.5V) instead of all being at the desired voltage of –3V. This is further illustrated by the curves (101, 102) of FIG. 2, representing exemplary DC average voltage profiles for drains and bodies of the transistors of a switch stack respectively, plotted with reference to the position of the transistors in the stack. As can be noticed from graph (101) and as mentioned previously, the transistor in the middle of the stack experiences the most deviation in DC drain voltage compared to the ideal/desired scenario, due to the flow of the undesired current "Ibody" within the drain-source resistor ladder. As for the bodies of the transistors, the deviation from the desired voltages is larger for the transistors located closer to the top of the stack, as illustrated by graph (102) of FIG. 2.

One way to reduce the undesired voltage drops across the bias resistors as described above is to reduce all of the biasing resistors values. This comes at the expense of an overall circuit performance degradation. Firstly, as a result of implementing smaller biasing resistances, the equivalent resistance of the switch stack in the OFF state ($R_{off}$) will be smaller. This will result in a degradation of the Quality factor (Q) of the circuit. Secondly, the smaller is the biasing resistances, the higher is the cut-off frequency of the switch stack, which is also undesirable from an overall switch performance standpoint. In other words, there is a tradeoff between the power handling of the switch stack and overall system performance parameters such as Q and cut-off frequency, such tradeoff imposing challenges when designing switch stacks as part of RF communication systems.

SUMMARY

As mentioned above, undesired currents generated in switch stacks during operative conditions, more in particular when such switch stacks are in the OFF state, may alter the balance of a desired DC voltage distribution across the switch stack. There is a need for an effective and practical solution to undo such undesired effects on the voltage distribution.

With continued reference to the body leakage current case as mentioned above, there are two issues associated with the presence of the body leakage current, Ibody, when FET switch stacks are in OFF state:

1. Leakage current generation issue: the negative power supply is required to generate and handle such current circulating within the switch. This current is much larger compared to the near zero current in the ideal/desired scenario where the leakage current would not have been present. This results in a more expensive design, at least from the standpoint of the required space on the chip.
2. Bias voltage distribution issue: the flow of the body leakage current changes the voltage distribution across the stack causing reduced power handling capability for the transistors within the switch stack.

Methods and devices described in the present disclosure address the problem of voltage distribution imbalance as described above, and more in particular, the bias voltage distribution issue associated with the undesired flow of the body leakage current. As will be detailed later, the disclosed methods and devices allow the biasing resistor values in a FET switch stack to be increased by providing some local charge support at specific points in such switch stacks.

According to a first aspect of the disclosure, a FET switch stack is provided, comprising: a plurality of field effect transistors (FETs) connected in series; and a drain-source resistive ladder comprising a plurality of drain-source resistor networks connected in series, each drain-source resistor network connected across a drain and a source of a corresponding FET of the plurality of FETs; wherein: the plurality of FETs is connected at one end to a radio frequency (RF) terminal and at another end to a first reference voltage; the plurality of FETs comprises a first FET and a second FET, a source terminal of the first FET being connected to a drain terminal of the second FET; the plurality of drain-source resistor networks comprises a first drain-source resistor network connected across a drain terminal and the source terminal of the first FET and a second drain-source resistor network connected across the drain terminal and a source terminal of the second FET; the first drain-source resistor network comprises two or more drain-source resistors, thereby providing a first tapping point of the first drain-source resistor network; and the second drain-source resistor network comprises two or more drain-source resistors, thereby providing a second tapping point of the second drain-source resistor network, the FET switch stack further comprising: one or more drain-source charge control elements comprising a first drain-source charge control element connected to the first tapping point and the second tapping point and coupled to the source terminal of the first FET and the drain terminal of the second FET.

According to a second aspect of the disclosure, method of driving the bias voltages of a FET switch stack towards a desired DC voltage distribution across the FET switch stack is disclosed, comprising: generating radio-frequency (RF) voltage sources across the FET switch stack from an RF signal; generating voltages within the FET switch stack from the generated RF voltage sources; using the generated voltages to create the desired DC voltage distribution Further aspects of the disclosure are provided in the description, drawings and claims of the present application.

BRIEF DESCRIPTION OF THE DRAWINGS

FIG. 1A' shows a prior art transistor with the leakage current flowing from the drain and the source terminals to the body terminal.

DETAILED DESCRIPTION

Figure 1A:
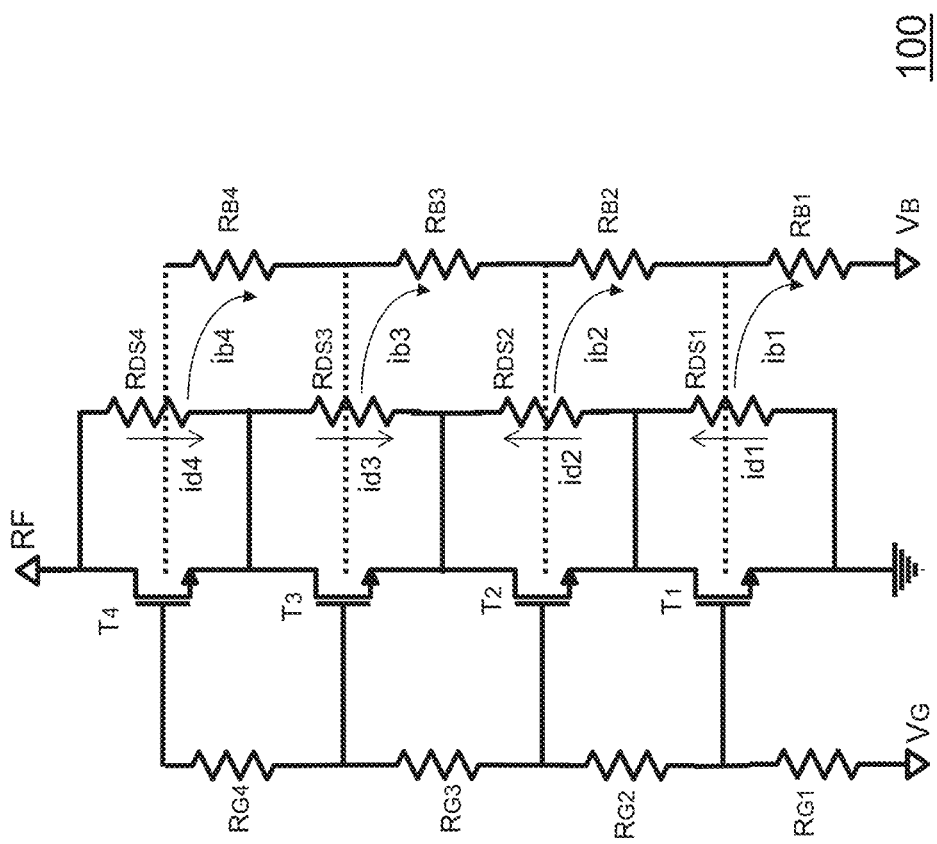
FIGS. 1A, 1B, and 1C show prior art FET switch stacks.
Figure 1A:
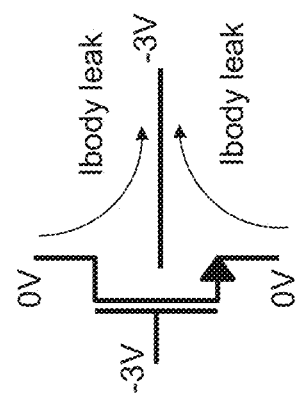
Figure 1C:
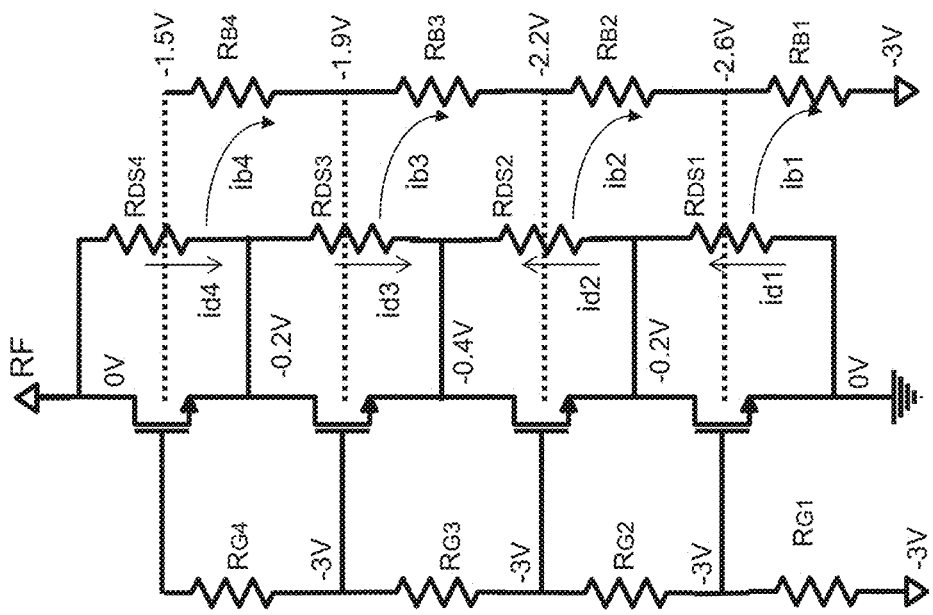
Figure 1B:
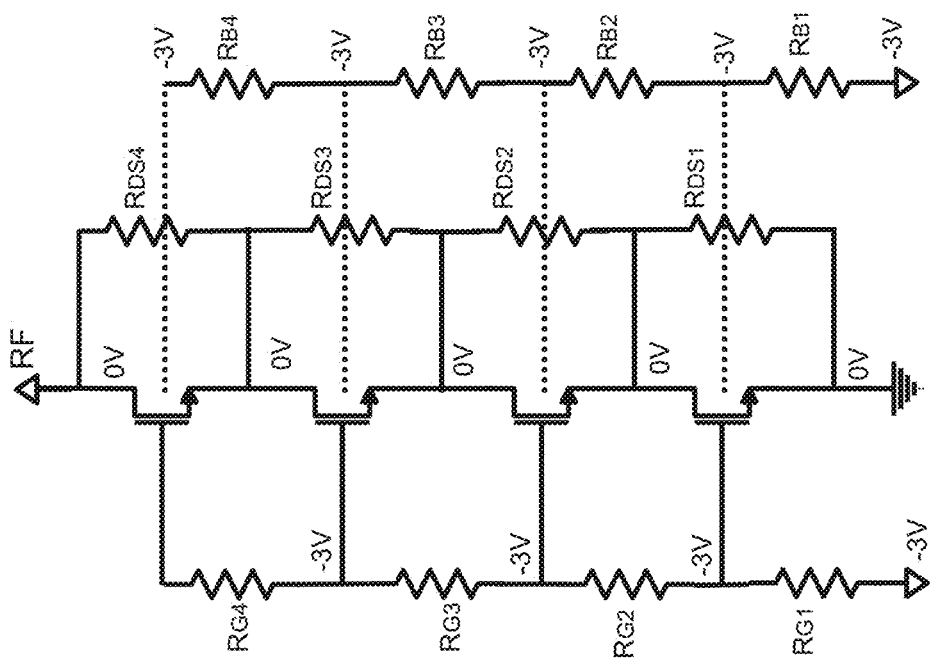
Figure 2:
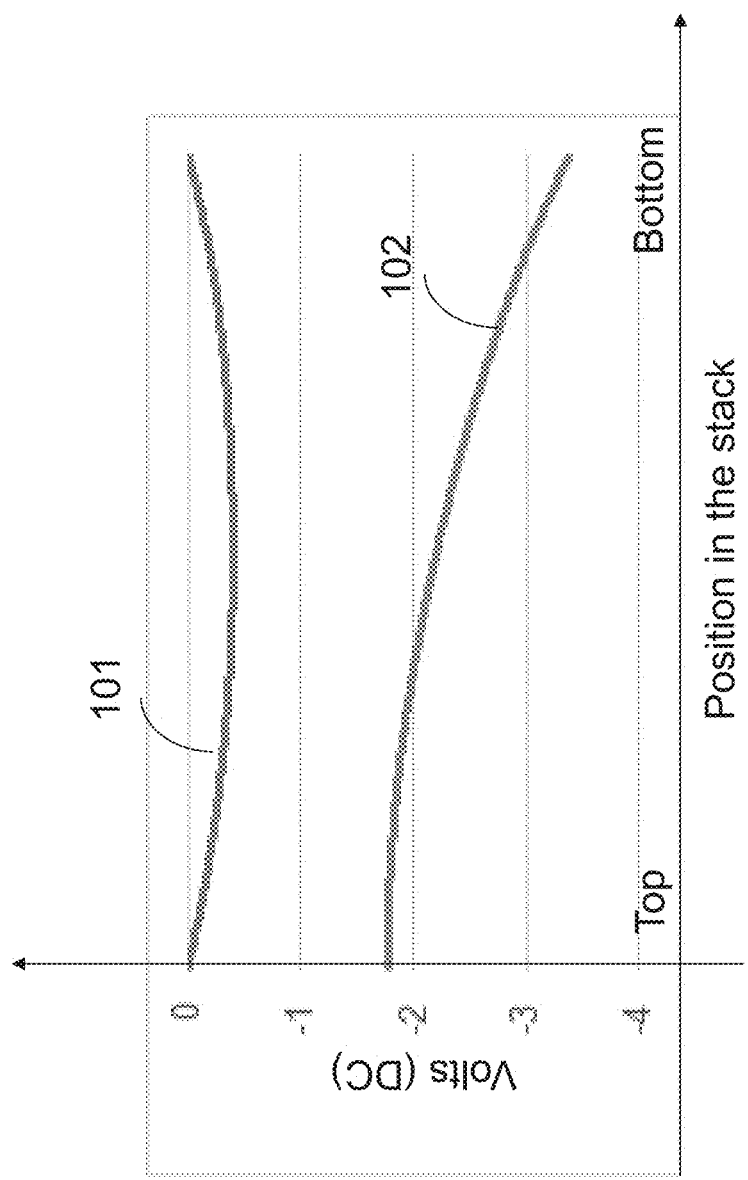
FIG. 2 shows prior art graphs illustrating variations of drain and body DC bias voltages vs. position in a FET switch stack in the OFF state and experiencing RF swing.
Figure 3:
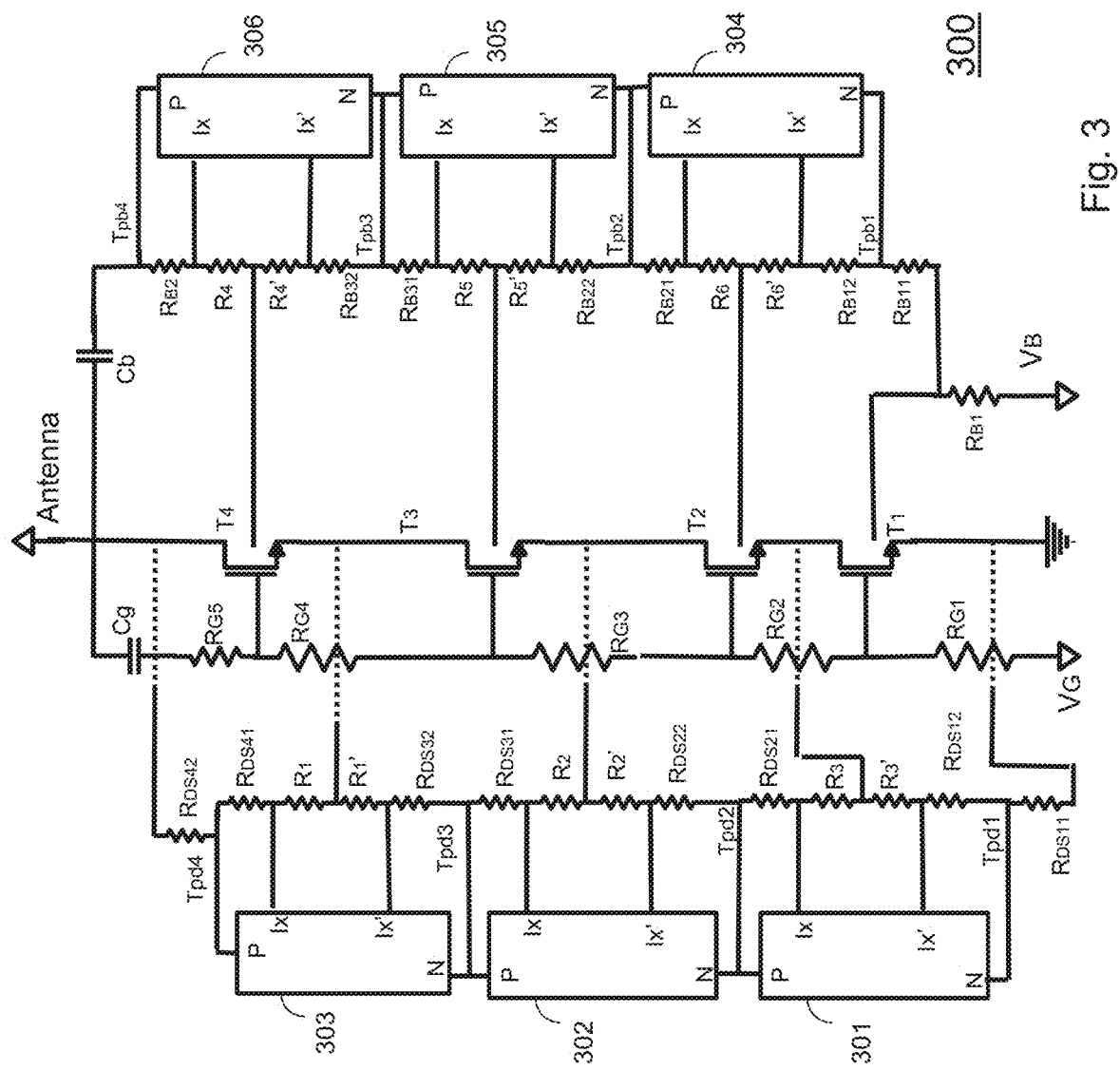
FIG. 3 shows an exemplary switch stack according to an embodiment of the present disclosure.

FIG. 3 shows a FET switch stack (300) in accordance with an embodiment of the present disclosure. The FET switch stack (300) comprises a plurality of transistors (T1, ..., T4) connected in series, a gate resistive ladder including gate resistors ($R_{G1}$, ..., $R_{G5}$), a body resistive ladder including body resistors ($R_{B1}$, $R_{B11}$, $R_{B12}$, $R_6'$, $R_6$ ..., $R_{B31}$, $R_{B32}$, $R_{4'}$, $R_4$, $R_{B2}$) and a drain-source resistive ladder including drain-source resistors ($R_{DS11}$, $R_{DS12}$, $R_3'$, $R_3$, ..., $R_{DS41}$, $R_{DS42}$). The resistive ladders are essentially used to bias the gate/source/drain/body terminals of each of the transistors in the FET switch stack. The FET switch stack (300) is coupled to an antenna or RF port (RF Path) on the top side to receive RF signals and connected to a reference voltage that may be ground, at another end. The gate resistive ladder is coupled to the antenna at one end and connected to reference voltage ($V_G$) at another end. Similarly, the body resistive ladder is coupled to the antenna at one end and connected to reference voltage ($V_B$) at another end.

The gate resistive ladder may further comprise a series capacitor (Cg) coupling the top gate resistor ($R_{G5}$) to the antenna. Similarly, the body resistive ladder further comprises series capacitor (Cb) coupling the top body resistor ($R_{B2}$) to the antenna. Capacitor (Cb) is optional, meaning that embodiments in accordance with the present disclosure may also be envisaged, wherein capacitor (Cb) is not employed. However, the presence of capacitor (Cb) is beneficial to the overall performance of the FET switch stack (300). As described in detail in the above-incorporated U.S. Pat. No. 10,236,872 B1, this capacitor has the benefit of practically eliminating the RF load across the top transistor (T4) coupled to the antenna. This will allow a more uniform/balanced division of the voltage across the ladders and also a reduction of the negative impact of the parasitic capacitances (existing throughout the entire circuit) on uniform division of the RF voltage across the body resistive ladder.

As shown in FIG. 3, the drain-source and the body biasing resistors may each include a combination of resistors or alternatively be accessible at an intermediate point (e.g. a mid-point). As described later and more in detail, bias resistors used to provide bias voltages to drain/source/body of each transistor, may be split into two serially connected resistors to provide tapping points throughout the drain-source and the body resistive ladders, while maintaining the DC biasing functionality to the corresponding transistors. In accordance with the teachings of the present disclosure, the provided tapping points may be used to sample the RF signal to locally generate charges that may improve the distribution of the DC voltages across the switch stack.

To further clarify this point and as an example, the series combination of resistors ($R_{DS21}$, $R_{DS22}$) of FIG. 3 is used to DC bias the drain/source of transistor (T2) while providing tapping point ($T_{pd2}$). In line with this and as shown in FIG. 3, the FET switch stack (300) further comprises tapping points ($T_{pd1}$, ..., $T_{pd4}$) on the drain-source resistive ladder side and tapping points ($T_{pb1}$, ..., $T_{pb4}$) on the body resistive ladder side.

With continued reference to FIG. 3, the FET switch stack (300) further comprises a first plurality of charge control elements (301, 302, 303) coupled with the drain-source resistive ladder and a second plurality of charge control elements (304, 305, 306) coupled with the body resistive ladder. Each charge control element comprises terminals (N, P, Ix, Ix') that are used to couple the charge control element to the corresponding resistive ladder. For example, on the drain-source resistive ladder side, terminals (P, N) of charge control element (302) are connected to corresponding tapping points ($T_{pd3}$, $T_{pd2}$) respectively, terminal (Ix) is connected to the intermediate point of resistors ($R_{Ds31}$, $R_2$) and terminal (Ix') is connected to the intermediate point of resistors ($R_{DS22}$, $R_{2'}$). Additionally, the intermediate point of resistors ($R_2$, $R_{2'}$) is connected to the source and drain of corresponding transistors (T3, T2) respectively. As a further example, on the body resistive ladder side, terminals (P, N) of the charge control element (305) are connected to corresponding tapping points ($T_{pb3}$, $T_{pb2}$). Additionally, the intermediate point of resistors ($R_{B31}$, $R_5$) is connected to terminal (Ix) of element (305), the intermediate point of resistors ($R_{B22}$, $R_{5'}$) is connected to terminal (Ix') of element (305), and the intermediate point of resistors ($R_5$, $R_{5'}$) is connected to the body terminal of the corresponding transistor (T3). When the FET switch stack (300) is in the OFF state, and as mentioned above, the main function of each charge control element is to sample the RF swing at the corresponding tapping points. Considering the example of the body leakage current previously described, the sampled voltage may be used, for example, to redistribute DC voltages with proper polarity to reduce the drooping of the drain and reduce the rising of the body terminals of the corresponding transistor within the stack. In accordance with embodiments of the present disclosure, the FET switch stack (300) may include only one of a) charge control elements (301, 302, 303) or b) charge control elements (304, 305, 306) or a combination of both. According to various embodiments of the present disclosure, some or all of resistors ($R_1$, $R_{1'}$, $R_6$, $R_{6'}$) may have zero resistance, i.e. they may be shorted.

In what follows, and using exemplary embodiments of the present disclosure, details of the functionality of the charge control elements are described. The following will also describe the application of charge control elements that utilize the RF voltage signal in one or more of the above mentioned resistive ladders to generate DC voltage differences that can be strategically superimposed on the existing voltage distribution along the ladder to which voltage is applied. By creating voltage differences between i) certain terminals within the ladder that are connected to the FET switch stack with respect to ii) certain terminals within the ladder that are not connected to the FET switch stack, it is possible to realize a more desirable voltage distribution for the terminals connected to the FET switch stack and therefore, achieve the desired DC voltage distribution across the FET switch stack.

Figure 4A:
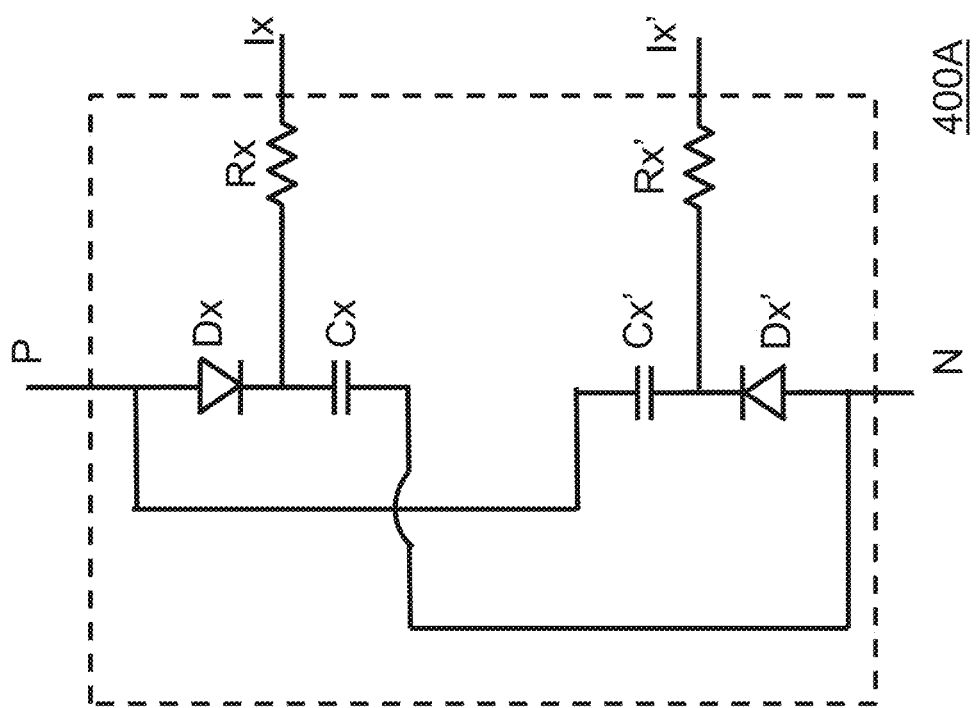
FIGS. 4A-4C show exemplary control elements according to embodiments of the present disclosure.

FIG. 4A shows a charge control element (400A) which constitutes an exemplary implementation of any one of charge control elements (301, 302, 303) of FIG. 3), according to the teachings of the present disclosure. The charge control element of FIG. 4A comprises diodes (Dx, Dx'), resistors (Rx, Rx') and capacitors (Cx, Cx'). In operative conditions, when the switch stack is in OFF state, diode (Dx) is in ON state during the positive half cycle of each RF swing and is OFF during the other (negative) half cycle of the same swing. On the other hand, diode (Dx') is in ON state during the negative cycle of each RF swing and is OFF during the other (positive) half cycle of the same RF swing.

Figure 5B:
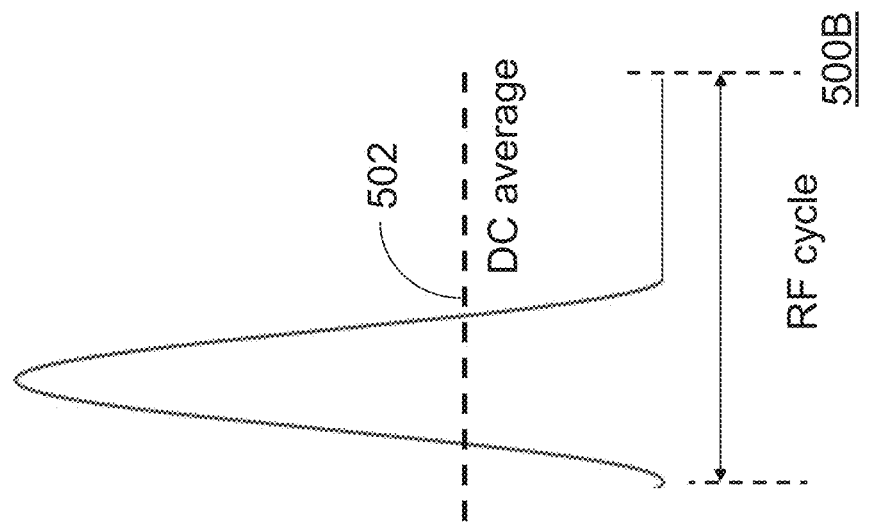
FIGS. 5A-5B shows voltage waveforms according to embodiments of the present disclosure.
Figure 5A:
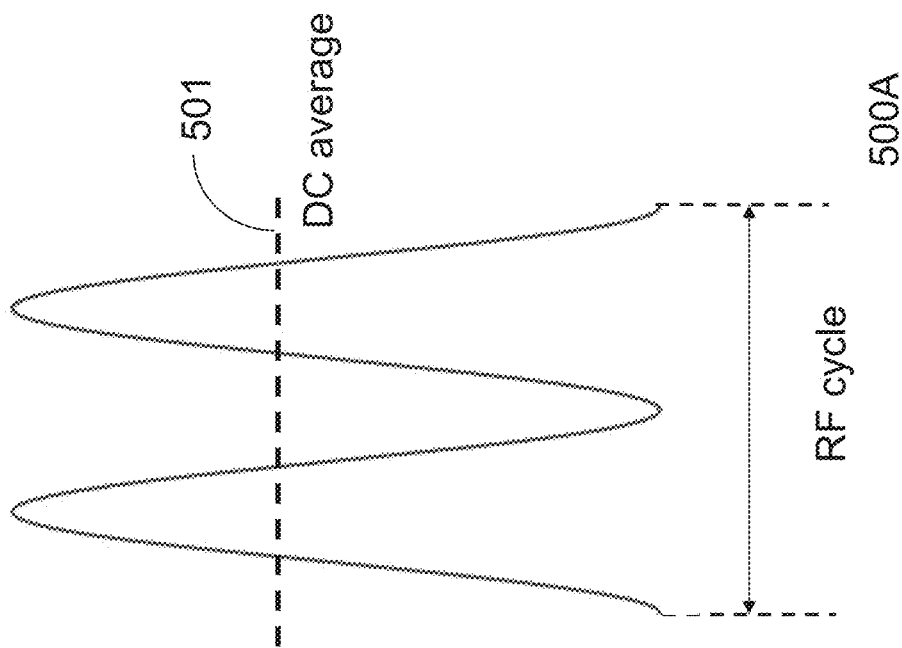

Reference will now be made to FIG. 5A, where curve (500A) represents the difference of the voltage of the drain terminal of for example, transistor (T3) of FIG. 3 with a charge control element as in FIG. 4A, between a state when the charge control element is applied to such drain terminal and a state when the charge control element is not applied thereto. Such a voltage difference has a DC average voltage (501), thus illustrating that the presence of the charge control element improves the voltage on the drain with respect to a realization without such element. The person skilled in the art will appreciate that, without distracting the functionality of the FET switch stack and by sampling the RF swing at the tapping points, the DC voltages of the drain terminals of the transistors are pulled higher to overcome the drooping issue or the undesired voltage distribution across the circuit, as previously described.

Figure 4B:
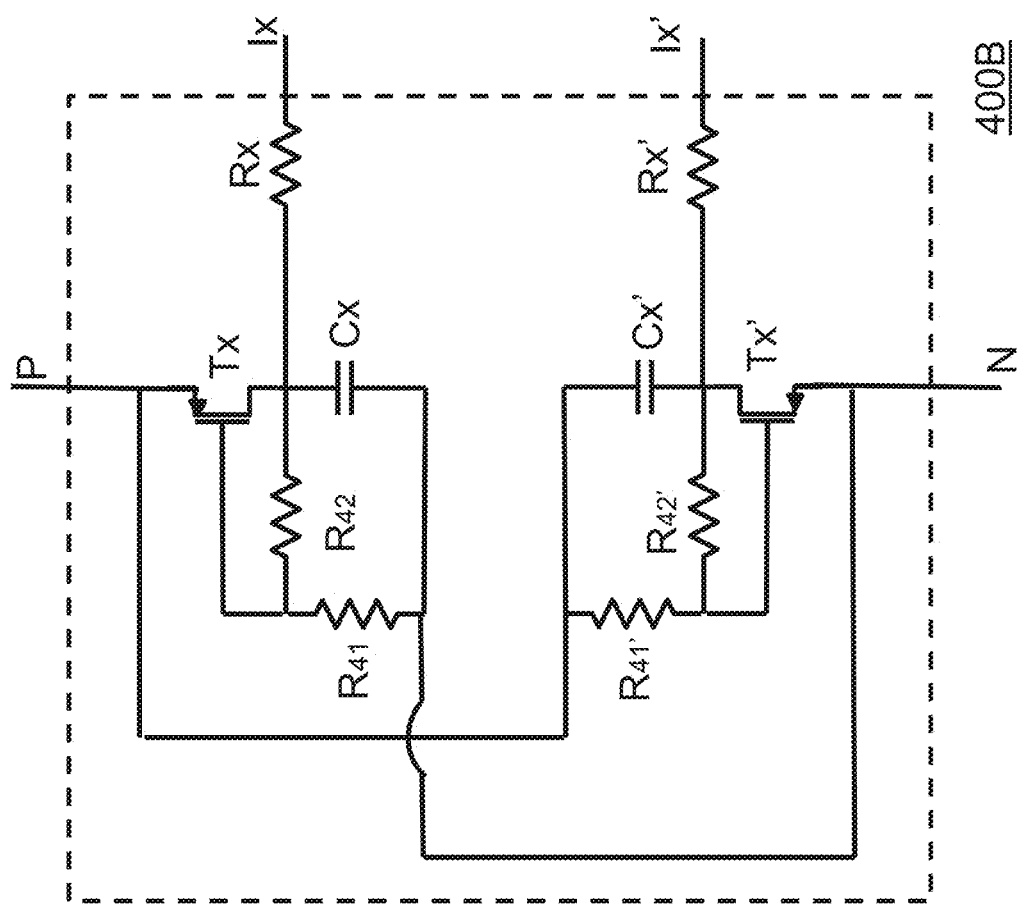
Figure 4C:
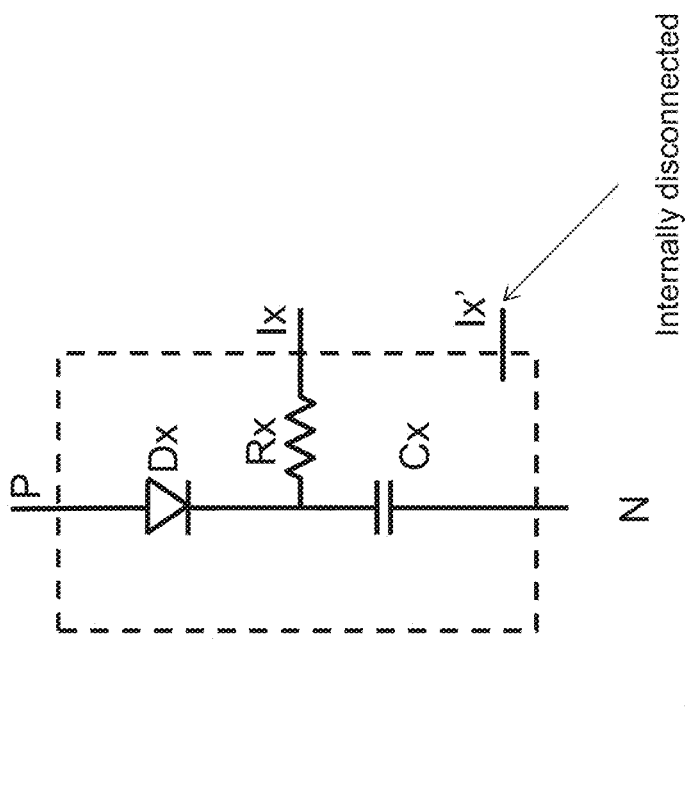

FIG. 4B shows a charge control element (400B) which constitutes another exemplary implementation of the charge control elements on the drain-source resistive ladder side, in accordance with an embodiment of the present disclosure. A combination of transistor (Tx) with resistors ($R_{41}$, $R_{42}$) functions as a diode with the same polarity of diode (Dx) of FIG. 4A. The resistance values of resistors ($R_{41}$, $R_{42}$) will indicate the location of the knee of the I-V curve of the diode and the general shape of such a curve. By way of example and not of limitation, $R_{41}$ may be an open and $R_{42}$ may be a short, although other resistance values may be envisaged for such resistors, and depending on the application. Similarly, a combination of transistor (Tx') with resistors ($R_{41'}$, $R_{42'}$) functions as a diode with the same polarity of diode (Dx') of FIG. 4A. Resistance values of resistors ($R_{41'}$, $R_{42'}$) will indicate the location of the knee of the I-V curve of such a diode and the general shape of its I-V curve. The principle of operation of the charge control element (400B) shown in FIG. 4B is similar to what was described with regards to the exemplary charge control element (400A) of FIG. 4A FIG. 4C shows a charge control element (400C) which constitutes yet another exemplary implementation of charge control elements (301, 302, 303) of FIG. 3. Charge control element (400C) comprises a diode (Dx) a capacitor (Cx) and a resistor (Rx). As shown in FIG. 4C, terminal (Ix') is not internally connected. In operative conditions, when the switch stack is in OFF state, diode (Dx) is in ON state during the positive half cycle of each RF swing and is OFF during the other (negative) half cycle of the same swing.

Similarly to what shown in FIG. 5A, FIG. 5B shows a curve (500B) representing a voltage difference at the drain terminal of for example, transistor (T3) of FIG. 3 with a charge control element as in FIG. 4C, between a state when the charge control element is applied to such drain terminal and a state when the charge control element is not applied to the same. Such voltage difference has an average DC voltage (502), meaning that similarly to the case of charge control elements (400A, 400B), the drain terminals of the transistors are pulled higher to counteract the undesired voltage distribution through the circuit, as described before.

Figure 6A:
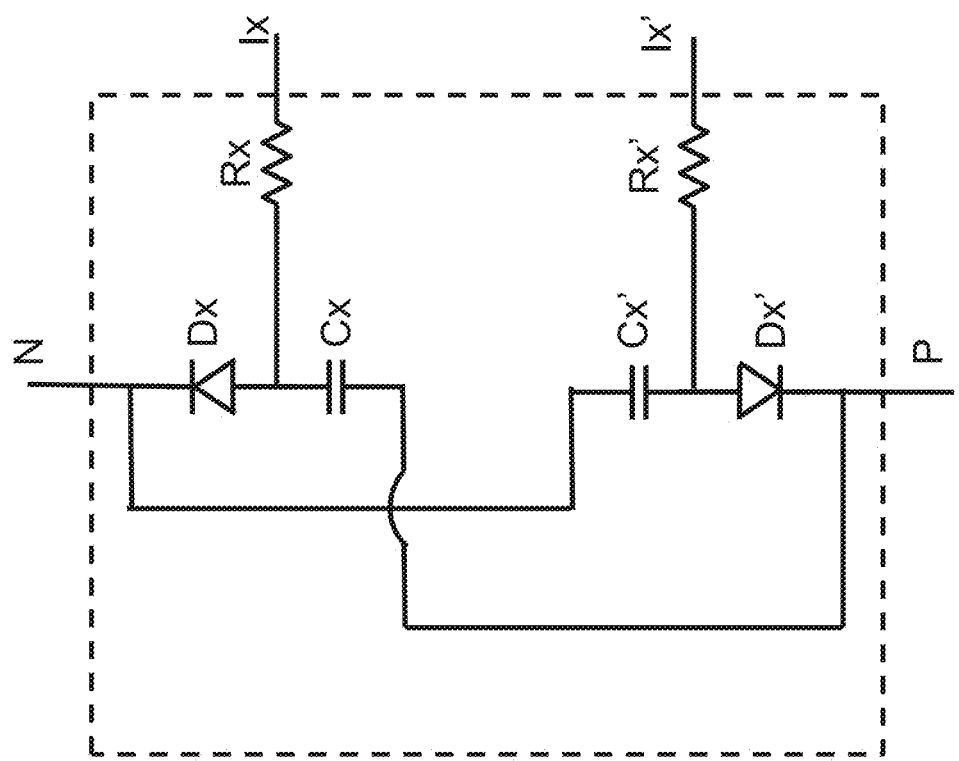
FIGS. 6A-6C show exemplary control elements according to embodiments of the present disclosure.
Figure 6B:
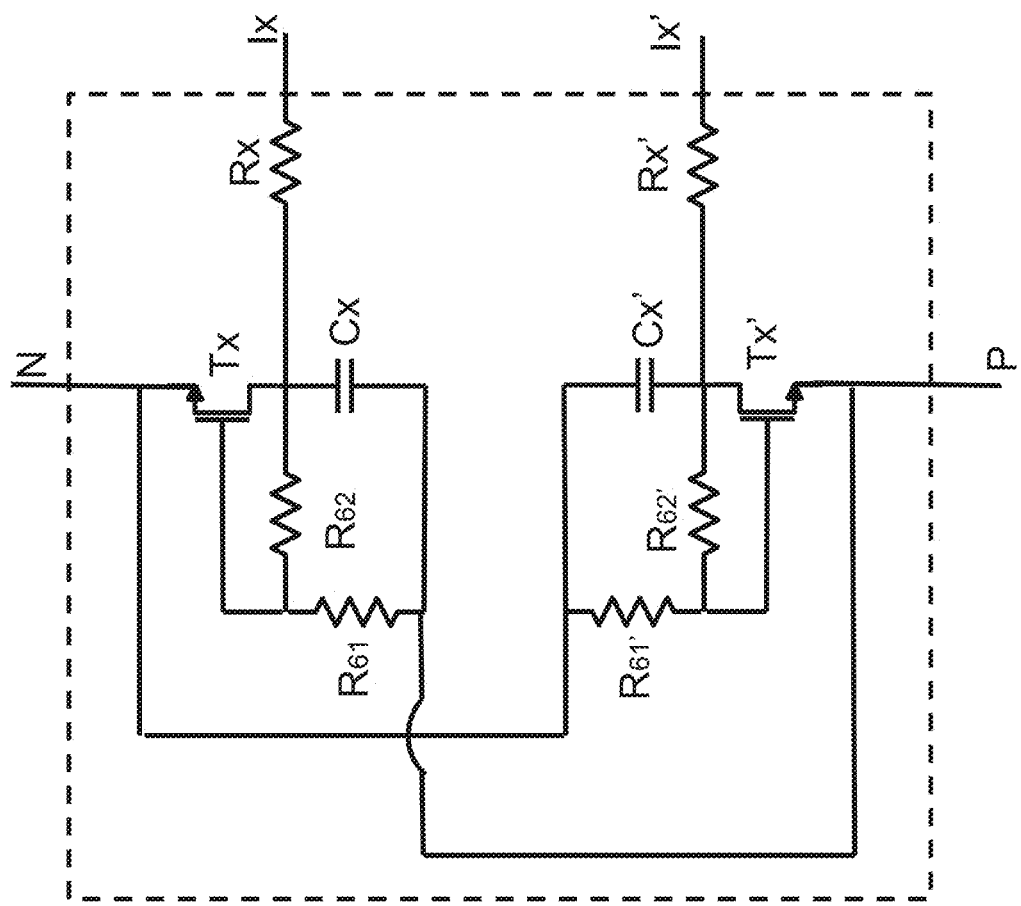
Figure 6C:
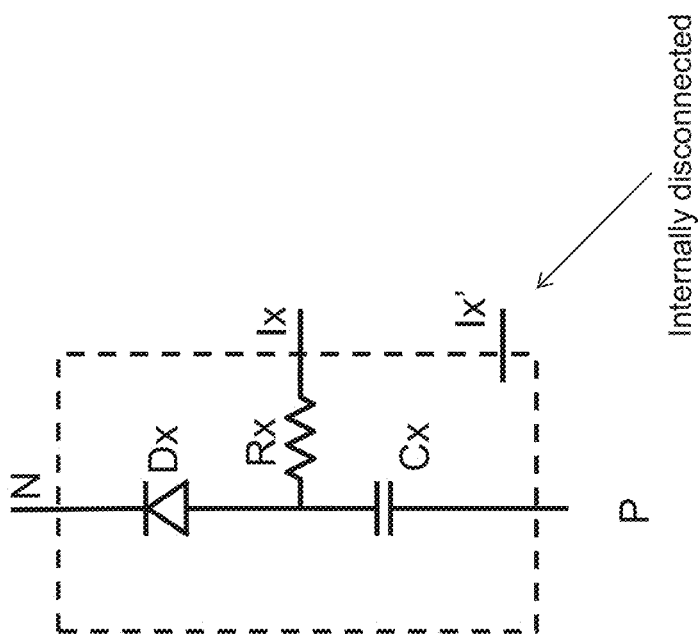

FIGS. 6A-6C show exemplary implementations of the charge control elements (304, 305, 306) of FIG. 3. As described before, due to impairments such as body leakage current, the DC voltage levels of the body terminals of the transistors of FIG. 3 may be higher than expected, causing an undesired distribution of DC voltages throughout the circuit.

The principle of operation of charge control element (600A) of FIG. 6A is similar to that of its counterpart, i.e. charge control element (400A) of FIG. 4A, except that the diodes of FIG. 6A have opposite polarities of their counterparts of FIG. 4A. Given such opposite polarities, the voltage difference between body terminals of the transistors of FIG. 3 and their corresponding tapping points has this time a negative DC value and as a result, the body terminals of the transistors are pulled lower to overcome the undesired DC voltage distribution across the circuit and as described above.

The principle of operation of charge control element (600B) of FIG. 6B is similar to that of its counterpart, i.e. charge control element (400B) of FIG. 4B, except that the transistors used in charge control element (600B) are NMOS transistors, differently from their counterparts in FIG. 4B, which are PMOS transistors. As a result of such a difference, the voltage difference between body terminals of the transistors of FIG. 3 and their corresponding tapping points has a negative DC value. As a result, the base terminals of the transistors are pulled lower to overcome the undesired DC voltage distribution across the circuit, as described above.

The principle of operation of charge control element (600C) of FIG. 6C is similar to that of its counterpart, i.e. charge control element (400C) of FIG. 4C, except that the diode of FIG. 6C has the opposite polarity of its FIG. 4C counterpart. Given such difference, the voltage difference between body terminals of the transistors of FIG. 3 and their corresponding tapping points will this time have a negative DC value, As a result, the body terminals of the transistors are pulled lower to overcome the undesired DC voltage distribution across the circuit, as described above.

With reference to FIGS. 4A-4C and 6A-6C, according the teachings of the present disclosure, capacitor (Cx) is optional, which means that the charge control elements may be implemented without using any capacitor.

With further reference to FIGS. 4A-4C and 6A-6C, in a typical operating condition, capacitor (Cx) may charge and discharge during a full RF swing without storing charges. In certain applications, for example where the body leakage current is not an issue, larger drain-source resistors may be implemented such that during a full RF swing, capacitor (Cx) is not fully discharged and as a result, stores charges thus functioning as a battery. In this case, in operative conditions, when the switch stack is in OFF state, Diode (Dx) is in ON state during a half cycle of each RF swing and is OFF during the other half cycle of the same swing. During the half cycle when diode (Dx) is ON, capacitor (Cx) charges, maintaining its charge during the other half cycle when the Diode (Dx) is OFF. In other words, capacitor (Cx) may function essentially as a battery feeding the corresponding tapping point with charge, thereby reducing the voltage droop of the drain/body of the corresponding transistor. According to an embodiment of the present disclosure, Diode (Dx) may be implemented using a FET transistor.

Figure 7A:
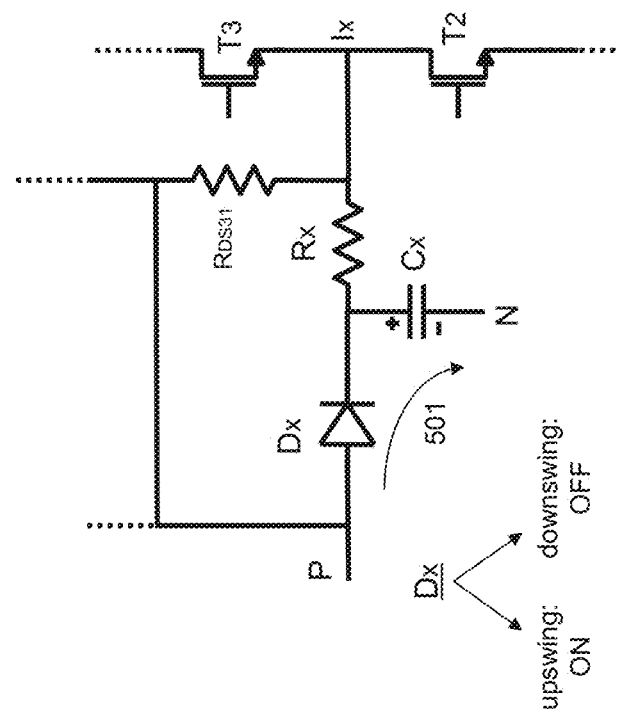
FIGS. 7A-7B show portions of the switch stack of FIG. 3.

Continuing with the same application mentioned in the previous paragraph, in order to further clarify the details of operation of the control elements, reference is made to FIG. 7A showing a portion of the FET switch stack (300) of FIG. 3, on the drain-source resistive ladder side, wherein the control element (302) is implemented using the embodiment of FIG. 4C. Without loss of generality, for the sake of simplicity, resistors ($R_2$, $R_{2'}$) are assumed here to be shorted. Diode (Dx) of FIG. 7A is ON during the upswing of the RF swing and is OFF during the downswing. Capacitor (Cx) is charged when diode (Dx) is conducting, and with the polarity as shown in FIG. 5A. Arrow (501) shows the direction of the current charging capacitor (Cx). Capacitor (Cx) functions similarly to a battery generating positive voltage to overcome undesired voltage distributions across the circuit, and as described previously. As a result, for example, the low drooping of the drain/source terminals of transistors (T2, T3) respectively is reduced.

The person skilled in the art will appreciate that in order to provide the charges required to counteract the drain terminal drooping, the RF swing is sampled at the tapping point ($T_{pd3}$) independently, and without distracting the operations of transistor (T3). The person skilled in art will also appreciate that by virtue of the control elements, the undesired drain terminals voltage distribution is migrated, at least partially, from the drain-source terminals to the tapping points that have virtually no direct impact on the general functionality of the switch stack.

Figure 7B:
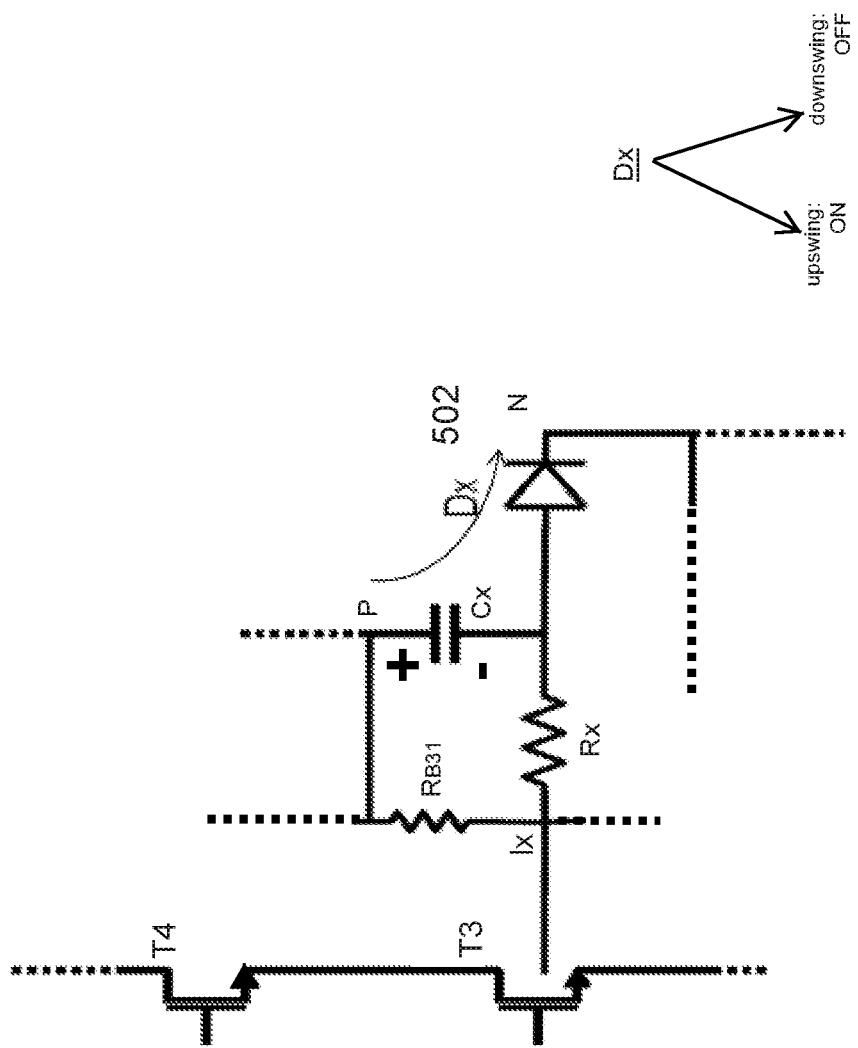

FIG. 7B shows a portion of the FET switch stack (300) of FIG. 3, on the body resistive ladder side, wherein the control element (305) is implemented using the embodiment of FIG. 6C. Without loss of generality and for the sake of simplicity, resistors ($R_5$, $R_{5'}$, $R_6$, $R_{6'}$) are assumed here to be all shorted. In operative conditions, when the switch stack is in the OFF state, capacitor (Cx) drives the RF swing. Diode (Dx) of FIG. 7B is ON during the upswing of each RF swing and is OFF during the downswing. Capacitor (Cx) of FIG. 7B is charged during the upswing with the polarity shown. Arrow (502) shows the direction of the flowing current charging capacitor (Cx). Capacitor (Cx) functions similarly to a battery generating negative voltage within the body resistive ladder, resulting in a reduction of the high voltage droop of the body terminal of the corresponding transistor (T3).

All of the previous descriptions and drawings related to voltage generation for the body resistive ladder are identically applicable to the gate resistive ladder. The same addition of tapping points and charge control elements used for the body resistor ladder can be applied to the gate resistor ladder, with the same polarity. Thus, application of tapping points and charge control elements can generate a more negative voltage at the points in the resistive ladder that are connected to the transistor gates than would be present in the absence of said charge control elements.

For many applications, having a more negative voltage on the gates of the transistors in a switch stack improves the power handling of the switch stack in the OFF or non-conducting state. This can include applying a negative voltage to the gates of the transistors in a switch stack. There are applications where no negative voltage is available and it would be costly to generate negative voltage. For those applications, application of charge control elements on the gate resistor ladder can generate negative voltages applied to the gates of the transistors without the need or cost of separately generating a negative voltage supply.

Switch stacks designed in accordance with embodiments of the present disclosure may be implemented as part of an integrated circuit chip or an electronic module, wherein the integrated circuit chip or the electronic module are part of a communication device. Further embodiments according to the present disclosure may also be envisaged, wherein the switch stacks as disclosed is part of the RF front-end of an electronic circuit or an electronic module or a communication device.

In accordance with further embodiments of the present disclosure:

The FET switch stack (300) of FIG. 3 may include two or more transistors.

The FET switch stack (300) of FIG. 3 may include one or more charge control elements implemented either on the drain-source resistive ladder side and/or on the body resistive ladder side. In other words, the number of one or more charge control elements on each side may be greater or equal to one and less than the number of transistors. The one or more charge control elements may be implemented at any location of the corresponding resistive ladders. For example, the charge control elements may be implemented closer to the top, to the bottom, or to the middle of the resistive ladders or a combination thereof.

Charge control elements with the same or different constituents or a combination thereof may be employed to design switch stacks.

Reference voltages ($V_B$, $V_G$) may supply negative voltages.

Reference voltages ($V_B$, $V_G$) may supply the same or different voltage values.

Reference voltages ($V_B$, $V_G$) may be controlled by one or more bias control circuits to provide proper voltage values during the OFF and ON states of the FET switch stack.

Throughout the disclosure, for the purpose of describing the invention, the exemplary FET switch stacks were presented in a shunt configuration wherein the FET switch stacks are implemented between an antenna or RF port (RF path) and a reference voltage (e.g. ground). Embodiments in accordance with the present disclosure may also be envisaged wherein the FET switch stack may be implemented between any two points of an electronic circuit, in series configuration, or in any configuration other than shunt configuration.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A FET switch stack comprising:
a plurality of field effect transistors (FETs) connected in series; and
a drain-source resistive ladder comprising a plurality of drain-source resistor networks connected in series, each drain-source resistor network connected across a drain and a source of a corresponding FET of the plurality of FETs;
wherein:
the plurality of FETs is connected at one end to a first radio frequency (RF) terminal;
the plurality of FETs comprises a first FET and a second FET, a source terminal of the first FET being connected to a drain terminal of the second FET;
the plurality of drain-source resistor networks comprises a first drain-source resistor network including a serial connection of at least two first drain-source resistors connected to each other at a first tapping point, the serial connection of the at least two first drain-source resistors having a first terminal and a second terminal;
the plurality of drain-source resistor networks further comprises a second drain-source resistor network including a serial connection of at least two second drain-source resistors connected to each other at a second tapping point, the serial connection of the at least two second drain-source resistors having a third terminal and a fourth terminal;
the first terminal is directly connected to a drain terminal of the first FET and the second terminal is directly connected to a source terminal of the first FET;
the third terminal is directly connected to a drain terminal of the second FET and the fourth terminal is directly connected to a source terminal of the second FET;
the FET switch stack further comprising:
one or more drain-source charge control elements comprising a first drain-source charge control element connected to the first tapping point and the second tapping point;
the first drain-source charge control element comprising a first diode connected between the first tapping point and a first charge control resistor and a second diode connected between the second tapping point and a second charge control resistor.

2. The FET switch stack of claim 1 configured to be coupled to an RF signal at the first RF terminal and to use an RF voltage between the first tapping point of the first drain-source resistor network and the second tapping point of the second drain-source resistor network.

3. The FET switch stack of claim 2, wherein the first drain-source charge control element is configured to use the RF voltage between the first tapping point of the first drain-source resistor network and the second tapping point of the second drain-source resistor network to supply a first current to the source terminal of the first FET and the drain terminal of the second FET.

4. The FET switch stack of claim 1, wherein:
the first drain-source charge control element comprises a first terminal, a second terminal, and a third terminal, wherein:
an anode of the first diode is connected to the first terminal of the first drain-source charge control element;
the first charge control resistor is connected at one end to a cathode of the first diode and at another end is connected to the third terminal of the first drain-source charge control element:
the first terminal is connected to the first tapping point of the first drain-source resistor network;
the second terminal is connected to the second tapping point of the second drain-source resistor network; and
the third terminal is coupled to the source terminal of the first FET to supply the first current.

5. A FET switch stack comprising:
a plurality of field effect transistors (FETs) connected in series; and
a drain-source resistive ladder comprising a plurality of drain-source resistor networks connected in series, each drain-source resistor network connected across a drain and a source of a corresponding FET of the plurality of FETs;

wherein:

the plurality of FETs is connected at one end to a first radio frequency (RF) terminal;

the plurality of FETs comprises a first FET and a second FET, a source terminal of the first FET being connected to a drain terminal of the second FET;

the plurality of drain-source resistor networks comprises a first drain-source resistor network including a serial connection of at least two first drain-source resistors connected to each other at a first tapping point, the serial connection of the at least two first drain-source resistors having a first terminal and a second terminal;

the plurality of drain-source resistor networks further comprises a second drain-source resistor network including a serial connection of at least two second drain-source resistors connected to each other at a second tapping point, the serial connection of the at least two second drain-source resistors having a third terminal and a fourth terminal;

the first terminal is directly connected to a drain terminal of the first FET and the second terminal is directly connected to a source terminal of the first FET;

the third terminal is directly connected to a drain terminal of the second FET and the fourth terminal is directly connected to a source terminal of the second FET;

the FET switch stack further comprising:

one or more drain-source charge control elements comprising a first drain-source charge control element connected to the first tapping point and the second tapping point and coupled to the source terminal of the first FET and the drain terminal of the second FET;

wherein the first drain-source charge control element comprises a first diode and a first charge control resistor wherein:

an anode of the first diode is connected to the first terminal of the first drain-source charge control element;

the first charge control resistor is connected at one end to a cathode of the first diode and at another end is connected to the third terminal of the first drain-source charge control element.

6. The FET switch stack of claim 5, wherein:

during an upswing of the RF signal the first diode is conducting; and during a downswing of the RF signal the first diode is not conducting.

7. The FET switch stack of claim 5, wherein the first drain-source charge control element further comprises a second diode and a second charge control resistor, wherein:

an anode of the second diode is connected to the second terminal of the first drain-source charge control element;

the second resistor is connected at one end to a cathode of the second diode and at another end is connected to a fourth terminal of the first drain-source charge control element.

8. The FET switch stack of claim 7, wherein the third terminal is connected to the fourth terminal.

9. The FET switch stack of claim 7, wherein during an upswing of the RF signal the first diode is conducting and the second diode is not conducting; and during a downswing of the RF signal the first diode is not conducting and the second diode is conducting.

10. The FET switch stack of claim 7, wherein the first drain-source charge control element comprises a first capacitor.

11. The FET switch stack of claim 10, wherein the first capacitor is configured to be charged during an upswing of the RF signal.

12. The FET switch stack of claim 10, wherein the first capacitor has a first capacitor end connected to the second terminal of the first drain-source charge control element and a second capacitor end connected to the cathode of the first diode.

13. The FET switch stack of claim 12, wherein the first drain-source charge control element further comprises a second capacitor connected at one end to the first terminal of the first drain-source charge control element and connected at another end to the cathode of the second diode.

14. The FET switch stack of claim 1, wherein each FET of the plurality of FETs comprises a body terminal, the FET switch stack further comprising a body resistive ladder comprising a plurality of body resistor networks connected in series, each body resistor network connected across body terminals of corresponding adjacent transistors of the FET switch stack.

15. The FET switch stack of claim 14, wherein:

the plurality of body resistor networks comprises a first body resistor network comprising two or more body resistors thereby providing a first tapping point of the first body resistor network, and the plurality of body resistor networks comprises a second body resistor network comprising two or more body resistors thereby providing a second tapping point of the second body resistor network.

16. The FET switch stack of claim 15, further comprising one or more body charge control elements comprising a first body charge control element connected to the first tapping point of the first body resistor network and the second tapping point of the second body resistor network, wherein, the first body charge control element is configured to use the RF voltage source at the first tapping point of the first body resistor network, thereby sinking a current from the body terminal of the first FET.

17. The FET switch stack of claim 16, wherein:

the first body charge control element comprises a first terminal, a second terminal, and a third terminal, wherein:

the first terminal is connected to the first tapping point of the body resistive ladder;

the second terminal is connected to the second tapping point of the body resistive ladder; and the third terminal is coupled to a body terminal of the first FET.

18. The FET switch stack of claim 17, the first body charge control element further comprises a first diode and a first resistor, wherein:

a cathode of the first diode is connected to the second terminal of the first body charge control element, and the first resistor is connected at one end to an anode of the first diode and at another end is connected to the third terminal of the first body charge control element.

19. The FET switch stack of claim 18, wherein:

during the downswing of the RF signal the first diode is conducting, and during an upswing of the RF signal the first diode is not conducting.

20. The FET switch stack of claim 18, wherein the first body charge control element further comprises a second diode, and a second resistor, wherein:
- a cathode of the second diode is connected to the first terminal of the first body control element, and
- the second resistor is connected at one end to an anode of the second diode and at another end is connected to a fourth terminal of the first body control element.

21. The FET switch stack of claim 20, wherein the fourth terminal is connected to the third terminal.

22. The FET switch stack of claim 20, wherein
during an upswing of the RF signal the second diode is conducting and the first diode is not conducting; and
during a downswing of the RF signal the second diode is not conducting and the first diode is conducting.

23. The FET switch stack of claim 20, wherein the first body charge control element comprises a first capacitor.

24. The FET switch stack of claim 23, wherein the first capacitor is configured to be charged during a downswing of the RF signal.

25. The FET switch stack of claim 23, wherein the first capacitor is connected at one end to the first terminal of the first body control element and at another end to the anode of the first diode.

26. The FET switch stack of claim 25, further comprising a second capacitor connected at one end to the second terminal of the first body charge control element and at another end to the anode of the second diode.

27. The FET switch stack of claim 14, wherein the body resistive ladder is coupled at one end to the first RF terminal through a body resistive ladder capacitance connected in series with the plurality of body resistors and is coupled at the other end to a first reference voltage.

28. The FET switch stack of claim 27, further comprising a gate resistive ladder comprising a plurality of gate resistors connected in series, and wherein the gate resistive ladder is connected to a second reference voltage and coupled to the first RF terminal via a gate resistive ladder capacitor.

29. The FET switch stack of claim 28, wherein the first and the second reference voltages are controlled via bias control circuits.

30. The FET switch stack of claim 29, wherein:
the first and the second reference voltages are between ground and a negative voltage.

31. The FET switch stack of claim 1, wherein a drain terminal of the first FET is connected to the RF terminal.

32. The FET switch stack of claim 1, wherein a source terminal of the second FET is connected to the first reference voltage.

33. The FET switch stack of claim 1, wherein the plurality of FETs is connected at another end to a reference voltage.

34. The FET switch stack of claim 1, wherein the plurality of FETs is connected at another end to a second RF terminal.

35. The FET switch stack of claim 1, wherein the at least first two drain-source resistors and the at least two second drain-source resistors have all the same resistance value.

* * * * *